United States Patent [19]

Lamming

[11] 3,852,127

[45] Dec. 3, 1974

[54] METHOD OF MANUFACTURING DOUBLE DIFFUSED TRANSISTOR WITH BASE REGION PARTS OF DIFFERENT DEPTHS

[75] Inventor: Jack Stewart Lamming, Garston, Watford, England

[73] Assignee: U.S. Philips Corporation, New York, N.Y.

[22] Filed: July 27, 1966

[21] Appl. No.: 568,314

[30] Foreign Application Priority Data

July 30, 1965 Great Britain .................... 32843/65

[52] U.S. Cl. .............. 148/187, 148/190, 317/234 R

[51] Int. Cl. .............................................. H01l 7/44

[58] Field of Search ........ 317/235, 21, 22, 40, 40.1, 317/47.1, 48.4; 148/187, 189, 190

[56] References Cited

UNITED STATES PATENTS

| | | | |
|---|---|---|---|
| 2,802,760 | 8/1957 | Derick et al. | 148/187 |
| 2,840,497 | 6/1958 | Longini | 148/1.5 |
| 2,898,247 | 8/1959 | Hunter | 148/1.5 |
| 2,981,877 | 4/1961 | Noyct | 148/187 |
| 3,210,225 | 10/1965 | Brixey, Jr. | 148/187 |
| 3,223,904 | 12/1965 | Warner, Jr. et al. | 317/235 |
| 3,312,881 | 4/1967 | Yu | 317/235 |
| 3,335,342 | 8/1967 | Leistiko, Jr. et al. | 317/235 |
| 3,358,195 | 12/1967 | Onodera | 317/234 |
| 3,707,410 | 12/1972 | Tauchi et al. | 148/187 |

*Primary Examiner*—L. Dewayne Rutledge
*Assistant Examiner*—J. M. Davis
*Attorney, Agent, or Firm*—Frank R. Trifari; Jack Oisher

[57] ABSTRACT

A method of manufacturing a transistor by double diffusion is described. First one type impurities having a slow diffusion rate to form the emitter region are diffused. Then opposite type impurities having a high diffusion rate to form the base are diffused so that some traverse the emitter region, with the consequence that part of the base impurities are selectively retarded as they travel through the emitter region and penetrate to a lesser depth.

3 Claims, 23 Drawing Figures

INVENTOR.
JACK S. LAMMING
BY
Frank R. Trifari
AGENT

INVENTOR.
JACK S. LAMMING
BY

AGENT

INVENTOR.
JACK S. LAMMING
BY
[signature]
AGENT

INVENTOR.
JACK S. LAMMING
BY
Frank R. Trifari
AGENT

INVENTOR.
JACK S. LAMMING
BY

AGENT

INVENTOR.
JACK S. LAMMING
BY
Frank R. Trifari
AGENT

METHOD OF MANUFACTURING DOUBLE DIFFUSED TRANSISTOR WITH BASE REGION PARTS OF DIFFERENT DEPTHS

This invention relates to transistors comprising a semiconductor body or body part having a diffused emitter region of one conductivity type extending to one plane surface of the body or body part and situated in the body or body part internal to a diffused base region of the opposite conductivity type, the part of the base region situated directly below the emitter region lying at a depth in the body or body part from the one surface less than the depth of the adjacent part of the base region extending to the one surface and further relates to methods of manufacturing such transistors.

Transistors having a base region with a part situated directly below the emitter region lying at a depth in the semiconductor body from the surface less than the depth of an adjacent part of the base region extending to the surface have been described in Specification No. 1,018,673, in U.S. Pat. No. 3,333,997 and in "Zeits. f. angew. Physik", Vol. 18, No. 3, pp. 129–132, 1964. Such a configuration of the base region in a transistor having a diffused base region, particularly when the part of the base situated directly below the emitter region is relatively narrow and is of relatively high resisitivity and the part of the base region extending to the one surface is relatively wide and is of relatively low resistivity, leads to advantages with respect to electrical characteristics, particularly with respect to the base series resistance and the suitability of the transistor for A.G.C. purposes, which advantages will be described more fully hereinafter.

In the operation of junction transistors minority carriers are injected into the base region from the emitter region under the control of signal information for travel across the base region to the collector region, thereby giving rise to output currents in the circuitry associated with the collector region. The injected carriers move across the base region as a result of diffusion which, in the case of a transistor having a diffused base region in which the impurity concentration decreases from the emitter region towards the collector region, is augmented by the built in electrostatic field which imparts a drift to the injected minority carriers. Thus the structure of the base region serves, inter alia, to determine the output characteristics of the transistor, the transit time of the minority carriers across the base region determining the upper limit of frequency of operation at which significant gain is obtained. For good high frequency response it is important that the width of the base region is narrow. It is also important that the series resistance of the base region shall be low and in diffused base transistors various techniques are known for obtaining narrow base regions and providing ohmic contacts to the narrow base regions so that a low series resistance is obtained.

In the manufacture of so-called "double diffused" junction transistors, comprising diffused base and diffused emitter regions, the starting material is a slice of semiconductor material of one conductivity type. A conductivity type determining impurity element characteristic of the opposite conductivity type is diffused into the surface of the slice to form a first surface layer of the opposite conductivity type in which the base region is eventually located. A conductivity type determining impurity element characteristic of the one conductivity type is then diffused into the first surface layer to form a second surface layer which is of the one conductivity type extending only partially in the first layer and in which the emitter region is located. A basic problem initially associated with the manufacture of these devices, was to provide a suitable ohmic contact to the base region located in the buried first diffused surface layer and various alloying methods and mesa etching methods have been employed for this purpose.

The said problem to a large extent is overcome in the manufacture of the so-called "planar" double diffused transistor in which the base-collector junction surrounds the emitter-base junction within the semiconductor body and both junctions terminate at one plane surface of the semiconductor body below an adherent protective insulating layer on the one surface which has openings therein containing ohmic contact material to at least the emitter and base regions where they extend to the one surface.

The manufacture of a planar transistor involves the formation of an adherent protective insulating layer on one plane surface of a semiconductor body of one conductivity type, the diffusion of a conductivity type determining impurity element characteristic of the opposite conductivity type to which the insulating layer is impervious into a first surface portion of the body exposed by a first opening made in the insulating layer to form a base region of the opposite conductivity type, the subsequent diffusion of a conductivity type determining impurity element characteristic of the one type to which the insulating layer is impervious into a second surface portion exposed by a second opening made in the insulating layer, which is completely internal to the first surface portion previously exposed by the first opening, to form an emitter region of the one conductivity type completely internal to the base region, the formation of further openings in the insulating layer to expose at least the emitter and base regions where they extend to the surface and the deposition of ohmic contact material in these further openings. Generally during and/or subsequent to each diffusion step, a fresh insulating layer is formed in the respective opening which latter formed insulating layer in each case adjoins and is contiguous with the insulating layer initially present.

The formation of openings in the insulating layer is carried out with the aid of photoprocessing techniques, that is using photoresist materials, masking and etching techniques, to selectively remove parts of a photoresist layer on the surface of the insulating layer and thus by using suitable etching liquids to selectively remove corresponding parts of the insulating layer.

The width of the part of the base region situated directly below the emitter region is determined, inter alia, by the extent of the second diffusion and the width of the part of the base region extending to the surface at the side of the emitter region is determined by the extent of the second diffusion, the difference in areas of the first and second surface portions and their relative situation on the one surface. Generally the width of the part of the base region extending to the surface will be significantly larger than the width of the part of the base region situated directly below the emitter region in order to facilitate the formation of the further opening to expose the base region at the surface in which opening the ohmic contact material to the base region is deposited. The width of the base region is to be understood to mean the distance between the emitter base junction and the collector/base junction.

It has been found that in the manufacture of double diffused transistors and in particular in the manufacture of silicon planar transistors, there is a limit to the width of the base region part situated below the emitter region which can be obtained. This is because during the second diffusion, that is, the diffusion of the conductivity type determining impurity element characteristic of the one conductivity type, the passage of the impurity atoms characteristic of the one conductivity type has the effect of driving forward the previously diffused impurity atoms characteristic of the opposite conductivity type. Over a limit area corresponding substantially to that over which the second diffusion is made a part of the base-collector junction becomes pushed forward into the body from its previous location formed during the first diffusion. As diffusion of the conductivity type determining impurity element characteristic of the one conductivity type proceeds the location of the emitter-base junction moves forward and in front of this the base-collector junction is pushed forward. The effect is generally known as the "base push-out effect" or "collector dip". In the manufacture of a planar transistor, particularly where it is desired to form an n-p-n silicon planar transistor having a narrow base region part of one micron width or less, this effect may form a limitation on the width of the part of the base region situated directly below the emitter region and may result, in certain cases, to a constricted part of reduced width at the side of the emitter region which may give rise to poor electrical characteristics.

Due to this base push out effect the part of the base region lying directly below the emitter region lies at a depth in the body from the surface which is greater than the depth of the adjacent part of the base region extending to the surface. Furthermore in double diffused transistors in which the base and emitter regions are formed in order of succession, even when the conditions are such that the base push out effect does not occur to an appreciable extent the depth of the part of the base region situated below the emitter region will not be less than the depth of the adjacent part of the base region as occurs in transistors to which the present invention relates.

It is an object of the invention to provide an improved transistor of the kind described and to provide a method of manufacturing such a transistor.

According to one aspect of the invention a transistor comprises a semiconductor body or body part having a diffused emitter region of one conductivity type extending to one plane surface of the body or body part and situated in the body or body part internal to a diffused base region of the opposite conductivity type, and a collector region of the one conductivity type, the part of the base region situated directly below the emitter region lying at a depth in the body or body part from the one surface less than the depth of the adjacent part of the base region extending to the one surface, the emitter region containing a conductivity type determining impurity element characteristic of the one conductivity type diffused into a first exposed portion of the one surface and the diffused base region containing a conductivity type determining impurity element characteristic of the opposite conductivity type subsequently diffused into a second exposed portion of the one surface which is of greater area than and includes the first exposed surface portion during which diffusion the location of the p-n- junctions between the emitter and base regions and between the base and collector regions have been simultaneously determined.

According to another aspect of the invention in a method of manufacturing a transistor comprising a semiconductor body or body part having a diffused emitter region of one conductivity type extending to one plane surface of the body or body part and situated in the body internal to a diffused base region of the opposite conductivity type, the emitter and base regions are formed in order of succession by the diffusion into a first exposed portion of one plane surface of a semiconductor body or body part of one conductivity type of a conductivity type determing impurity element characteristic of the one conductivity type which has a relatively slow rate of diffusion in the semiconductor material of the body or body part and yields relatively high diffused concentrations and the subsequent diffusion into a second exposed portion of the one plane surface of the body or body part which is of greater area than and includes the first portion of a conductivity type determining impurity element characteristic of the opposite conductivity type which has a relatively fast rate of diffusion in the material of the semiconductor body or body part and which is selectively retarded in that part of the body containing the previously diffused conductivity type determining impurity element characteristic of the one conductivity type such that the part of the base region situated directly below the emitter region lies at a depth in the body from the one surface less than the depth of the adjacent part of the base region extending to the one surface.

The desired configuration of the base region is obtained by the selective retardation of the diffusion of the conductivity type determining impurity element characteristic of the opposite conductivity type. During this diffusion the location of the emitter-base junction and the location of the collector-base junction are simultaneously determined and a relatively narrow part of the base region may be obtained situated below the emitter region simultaneous with the obtainment of a part of the base region of greater thickness extending to the one surface which latter part lies at a greater depth in the body from the one surface than the narrow part situated directly below the emitter region. Thus by a diffusion process in which, contrary to the normal manufacture of a double diffused transistor in which the base diffusion is performed prior to the emitter diffusion, the emitter diffusion is performed prior to the base diffusion and it is possible to obtain a narrow base region part below the emitter region, which is desired for a device suitable for operation at high frequencies, together with a part extending to the surface such that a low base series resistance is obtained.

Also the previously described disadvantage of the base-collector junction being pushed forward from its initial location by the emitter impurity diffusion does not occur in the method according to the invention. Effectively the diffusion to form the emitter and base regions in order of succession may be considered as giving rise to the reversal of the base push out effect.

The retardation of the conductivity type determining impurity element characteristic of the opposite conductivity type by the concentration of the previously diffused conductivity type determining impurity element characteristic of the one conductivity type may be explained by considering the case, for example, when the body initially contains a uniform concentration of a donor element, the impurity element characteristic of the one conductivity type is a donor having a relatively slow rate of diffusion in the semiconductor material of the body and the impurity element characteristic of the opposite conductivity type is an acceptor having a relatively fast rate of diffusion in the semiconductor material of the body. The previously diffused donor impurity is ionised at the temperature of the acceptor diffusion and consequently the spatial distribution of the positive donor ions will produce a "built-in" field which will be more positive near the surface of the body. The acceptor impurity will be negatively ionised at the diffusion temperature and its entry into a passage through the semiconductor body will be opposed by the built-in field of the donor impurity ions. The diffusion coefficient of the acceptor atoms, through the region of the semiconductor body having the donor concentration gradient, will therefore be reduced. For a given acceptor impurity the extent of the retardation obtained is larger with a donor impurity having a larger diffusion coefficient and this may be due to the donor atoms moving along with the acceptor atoms during the second diffusion and thus a particular acceptor atom will be influenced by the donor retarding field for a longer time.

The semiconductor body may be of silicon, germanium or a III-V semiconductor compound such as gallium arsenide. The structure of the transistor is determined, inter alia, by the extent of the retardation diffusion effect obtainable in the semiconductor material of the body. In general, the retardation diffusion effect in these three materials will be most pronounced in gallium arsenide and least pronounced in germanium. The retardation effect is large when one of the impurities is present in one part of the body in considerable excess of both the other impurity and the intrinsic carrier concentration $n_i$. At typical diffusion temperature we have Ge ( 700– 900°C) $n_i = 3 \times 10^{18} - 10^{19}$ cm$^{-3}$ Si (1000 - 1200°C) $n_i = 3 \times 10^{18} - 10^{19}$ cm$^{-3}$ GaAs ( 700 - 900°C) $n_i = 2 \times 10^{16} - 10^{17}$ cm$^{-3}$.

It is difficult to get the concentration of impurities high enough in germanium to obtain a large retardation diffusion effect.

By the presence of the part of the base region lying at a greater depth in the body than the narrow part situated below the emitter, a transistor is obtained which is suitable for use in automatic gain control circuits since as the emitter current is increased the injection of minority carriers into the base region will become more concentrated at the sides of the emitter region so that the passage of minority carriers injected from these parts of the emitter region is across a wider part of the base region with a consequent increase in the transit time across the region. Therefore with increasing emitter current the frequency response will fall so that the power gain will fall.

Reference herein to forming the emitter region by the initial diffusion of the conductivity type determining impurity element characteristic of the one conductivity type is to be understood to mean the diffusion of the element to form a suitable emitter impurity concentration in the part of the body in which the emitter is eventually located and the boundary of which, that is, the emitter-base junction, is determined by the subsequent diffusion of the conductivity type determining impurity element characteristic of the opposite conductivity type.

The subsequent diffusion of the conductivity type determining impurity element characteristic of the opposite conductivity type may be into a second exposed portion of the one surface which surrounds the first portion on all sides, such that the diffused base region formed in the body or body part surrounds the emitter region on all sides within the body or body part.

The diffusion coefficient of the conductivity type determining impurity element characteristic of the opposite conductivity type in the material of the semiconductor body or body part of the one conductivity type may be at least five times, or even at least one hundred times, the diffusion coefficient of the conductivity type determining impurity element characteristic of the one conductivity type in the material of the semiconductor body or body part of the one conductivity type, at the diffusion temperatures concerned. The characteristics of the transistor will be determined, inter alia, by the difference in the diffusion coefficients of the two impurity elements and for optimum performance a difference as large as possible is desired. However, the actual impurity elements chosen will also be determined by their physical properties with reference to the material of the semiconductor body or body part and other materials employed in the manufacture.

FIG. 1 of the accompanying drawings is a graph showing the concentrations C of the impurities in a semiconductor body or body part as ordinates on a logarithmic scale and the distance from the surface as abscissae on a linear scale. For the sake of clarity the body or body part is initially shown as n-type, the first impurity diffused being a donor with a relatively slow diffusion coefficient in the material of the body or body part and the second impurity diffused being an acceptor having a relatively fast diffusion coefficient in the material of the body or body part. The acceptor diffusion is shown for the region of the body containing the previously diffused donor concentration in which region the diffusion is selectively retarded and for the adjacent region in which the diffusion is undisturbed. For the sake of convenience the acceptor surface concentration is shown the same for both regions. The sheet resistivity of the undisturbed acceptor distribution in the p-type base region at the sides of the *n*-type emitter region will be much less than the sheet resistivity of the part of the p-type base region situated below the emitter region containing the retarded acceptor distribution. Therefore, for a certain sheet resistivity in the effective base region, that is, the part of the base region situated below the emitter region, the overall base resistance of the transistor is less than in a double diffused transistor produced by first diffusing the acceptor impurity to form the base region followed by diffusing the donor impurity to form the emitter region. However, for a fixed acceptor impurity concentration at the emitter-base junction, the emitter efficiency is lower because there is a higher concentration of acceptor impurities in the n-type emitter region. Therefore, in the manufacture of a transistor by the method according to the invention the diffusion of the two impurities must be controlled to effect a suitable compromise between emitter efficiency and base resistance.

The conductivity type determining impurity element characteristic of the one conductivity type may be diffused into a first surface portion of the one surface exposed by an opening in an adherent protective insulating layer applied to the semiconductor body at least on the one plane surface and to which the said impurity element is impervious. Thereafter the diffusion of the conductivity type determining impurity element characteristic of the opposite conductivity type may be effected in various ways depending on the kind of transistor it is desired to manufacture, for example, a mesa transistor or a so-called "planar" transistor.

Thus in one preferred form of the method in the manufacture of a so-called planar transistor an adherent protective insulating layer is formed on at least the one plane surface of the semiconductor body or body part, a first opening is made in the masking layer to expose the first surface portion, a conductivity type determining impurity element characteristic of the one conductivity type to which the insulating layer is impervious is diffused into the first surface portion so exposed to form an emitter region impurity concentration, a second opening is made in the same insulating layer to expose the second surface portion and a conductivity type determining impurity element characteristic of the opposite conductivity type to which the insulating layer is impervious is diffused into the second surface portion so exposed to form simultaneously the base-collector junction and the emitter-base junction which both extend to the one surface.

In this method during or subsequent to the diffusion of the conductivity type determining impurity element characteristic of the opposite conductivity type into the second portion an adherent protective insulating layer may be reformed on the second surface portion which adjoins the previously formed insulating layer and thereafter further openings are made in the insulating layer to expose the emitter and base regions where they extend to the one surface and ohmic contact to the emitter and base regions so exposed is made by depositing ohmic contact material in the further openings while leaving permanently in place the insulating layer covering the parts of the emitter-base junction and the base-collector junction that extend to the one surface. The semiconductor body may be of silicon and the adherent protective insulating layer of silicon oxide. The semiconductor body or body part initially may be of n-type silicon, the conductivity type determining impurity element characteristic of the one conductivity type first diffused is arsenic and the conductivity type determining impurity element characteristic of the opposite conductivity type subsequently diffused is boron.

Although the difference in the diffusion coefficients of the impurities arsenic and boron is not as high as, for example, arsenic and gallium, the impurities arsenic and boron are chosen because silicon oxide is impervious to the diffusion of these two impurities. Another pair of impurities also suitable for this method of manufacturing an n-p-n silicon planar transistor are antimony and boron, the diffusion of which is also effectively masked by silicon oxide.

In another preferred form of the method, in the manufacture of a so-called "mesa" transistor, the conductivity type determining impurity element characteristic of the one conductivity type is diffused into the first surface portion of the one surface exposed by a first opening in an adherent protective insulating layer on the one surface and to which the diffused element characteristic of the one conductivity type is impervious, subsequently the insulating layer is removed and thereafter the conductivity type determining impurity element characteristic of the opposite conductivity type is diffused over the entire area of the one surface. The semiconductor body or body part may be of silicon and the adherent protective insulating layer may be of silicon oxide.

Thus in one such method of manufacturing a mesa transistor the semiconductor body or body part initially is of n-type silicon, the conductivity type determining impurity element characteristic of the one conductivity type initially diffused is arsenic and the conductivity determining impurity element characteristic of the opposite conductivity type subsequently diffused is gallium. This pair of impurity elements is suitable since there is a relatively large difference in their diffusion coefficients and the impurity of the one type, that is, arsenic diffused through the opening in the silicon oxide layer is masked by the layer. Such a method in which the silicon oxide is removed from the surface prior to the gallium diffusion may be superior to a method in which the silicon oxide is still in position on parts of the surface during the gallium diffusion. The complete removal of the silicon oxide avoids the risk of diffusion of arsenic from the doped oxide and provides a clean oxide free surface over which the gallium diffusion occurs and beyond which the penetration depth will be uniform over the part not containing the previously diffused arsenic and also beyond which the penetration depth will be uniform, and hence also the retardation, over the part containing the previously diffused arsenic.

Other suitable pairs of impurity elements for this method of manufacturing an n-p-n silicon mesa transistor are arsenic and aluminum, arsenic and boron, arsenic and indium, phosphorus and gallium, antimony and gallium, antimony and aluminum, antimony and indium, antimony and boron, phosphorus and aluminum.

Subsequent to the second diffusion, a mesa structure is formed. There are various alternative methods of forming contacts to the emitter and base regions and performing mesa etching. In a preferred method subsequent to the diffusion over the entire area of the one surface of the conductivity type determining impurity element characteristic of the opposite conductivity type and adherent protective insulating layer is formed on the one surface, openings are made in the insulating layer to expose the emitter and base regions where they extend to the surface, ohmic contact is made to these regions by depositing ohmic contact material in the openings and thereater the body is etched to form a mesa and limit the lateral extent of the base region and underlying collector-base junction. When the semiconductor body or body part is of silicon, the insulating layer may be of silicon oxide which may be left permanently in place on at least that part of the surface where the emitter-base junction extends to the surface.

The invention will be described in greater detail with reference to the accompanying drawings wherein FIG. 1 is a graph which plots the concentration of impurities in a semiconductor as a function of distance into the semiconductor to illustrate principles of the invention;

Embodiments of the invention will now be described. Initially some examples of the successive diffusion of a donor element and an acceptor element into an n-type silicon body will be given. These examples serve to illustrate the selective retardation of the acceptor element by the presence of the concentration of the previously diffused donor element. Thereafter two examples of the method of manufacturing a transistor will be given, firstly a method of manufacturing a silicon planar double diffused transistor and secondly a method of manufacturing a silicon mesa double diffused transistor, with reference to FIGS. 2 to 18 and with reference to FIGS. 2 to 5 and 19 to 23 respectively of the accompanying drawings.

In the following examples, the starting material in each case is a wafer shaped n-type silicon body of dimensions 1 cm. × 0.8 cm. × 200 $\mu$ thickness and having a resistivity of 5 ohm-cm. being uniformly doped with phosphorus in a concentration of $10^{15}$ atoms/cc. In a manner commonly employed in the semiconductor art the body is covered with an adherent protective insulating layer of silicon oxide by oxidizing in moist oxygen. Openings are formed in the oxide layer on one major surface of the body to leave a plurality of stripes of the oxide extending across the surface each of 0.5 mm. width and having a mutual separation of 0.5 mm. This process is carried out with the use of photosensitive resist and an etching process also commonly employed in the semiconductor art.

EXAMPLE 1

Figure 1:
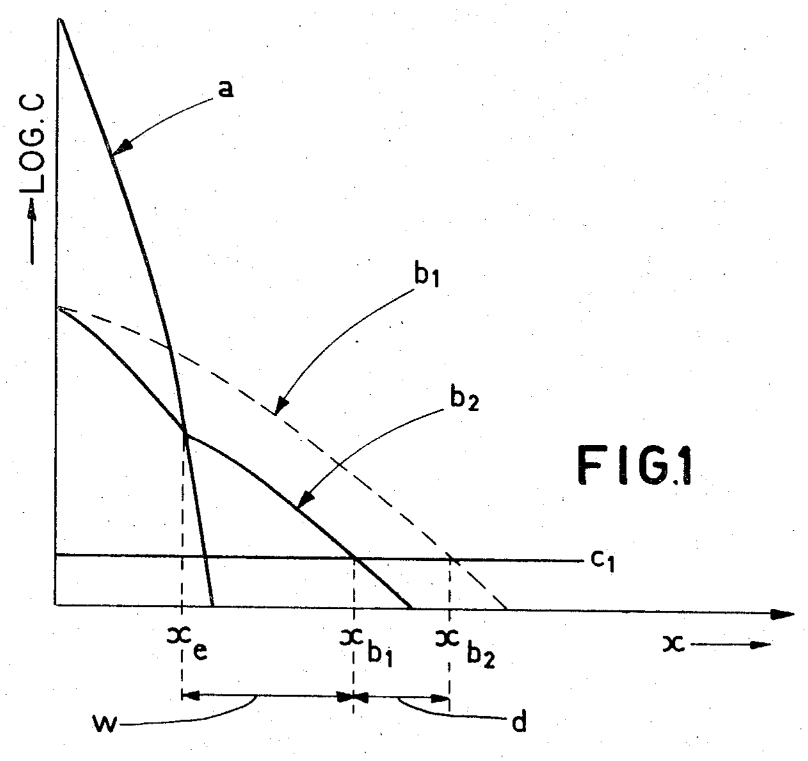

One such wafer was placed in an evacuated and sealed silica tube with a quantity of arsenic and heated at 1,000°C for 90 minutes to diffuse arsenic into the body through the openings in the silicon oxide layer and form $n^+$ regions in the body adjacent the surface in the apertures. This treatment yielded a surface concentration of arsenic in the apertures of greater than $10^{21}$ atoms/cc. The silicon oxide layer was then removed by dissolving in hydrogen fluoride. The body was then placed in a furnace adjacent a gallium oxide source and heated at 1,300°C for 4 minutes while a mixture of nitrogen and hydrogen was passed over the gallium oxide and then over the body. During this heating step gallium which was obtained from the gallium oxide and which diffuses more rapidly than arsenic in silicon, diffuses into the surface, penetrates deeper into the body than the previously diffused arsenic and is retarded in those parts of the body containing the previously diffused concentration of arsenic. In these regions adjacent the surface the arsenic concentration is greater than the diffused gallium concentration so these regions remain n-type. Hence the gallium diffusion simultaneously produces two p-n junctions and the gallium diffusion is retarded by the previously diffused arsenic concentration to such an extent that the p-n junction lying deepest in the body has a stepped form. FIG. 1 shows the kind of impurity distribution pattern obtained by a method according to the invention. In the diagram of FIG. 1, C is plotted against $x$, C being the impurity concentration and $x$ the distance from the surface of the wafer. The line $C_1$ relates to the original donor concentration in the starting wafer, the curve $b_1$ relates to undisturbed acceptor diffusion and the curve $b_2$ to retarded acceptor diffusion, the curve a relates to the diffused donor. The dimensions $x_e$, $x_{b_1}$, $x_{b_2}$, $w$ and $d$ indicated in FIG. 1 are measured using a suitable sectioning and staining technique. The values obtained were as follows:

$x_e = 2.9\ \mu$, $x_{b_1} = 4.3\ \mu$, $x_{b_2} = 4.8\ \mu$,
$w = 1.4\ \mu$ and $d = 0.5\ \mu$.

Thus the width of the narrow p-type regions located below the position where the silicon oxide was removed for the initial arsenic diffusion is 1.4 $\mu$ and the gallium diffusion has been retarded to such an extent that the step in the p-n junction lying deepest in the body is 0.5 $\mu$.

EXAMPLE 2

The conditions were similar to those for Example 1, except that the gallium diffusion was carried out for a longer period, namely 8 minutes at 1,300°C. This gave the following values:

$x_e = 3.5\ \mu$, $x_{b_1} = 6.9\ \mu$, $x_{b_2} = 7.7\ \mu$,
$w = 2.5\ \mu$ and $d = 0.8\ \mu$

EXAMPLE 3

The conditions were similar to those for Example 1, except that the gallium diffusion was carried out for 12 minutes at 1,300°C. This gave the following values:

$x_e = 3.5\ \mu$, $x_b = 6.9\ \mu$, $x_b = 7.7\ \mu$,
$w = 3.4\ \mu$, $d = 0.8\ \mu$.

EXAMPLE 4

The conditions were similar to those for Example 1, except that the gallium diffusion was carried out for 16 minutes at 1,300°C. This gave the following values:

$x_e = 3.8\ \mu$, $x_{b_1} = 7.5\ \mu$, $x_{b_2} = 8.3\ \mu$,
$w = 3.7\ \mu$ and $d = 0.8\ \mu$.

EXAMPLE 5

In this example, the starting material was the same as in Example 1, but instead of an initial arsenic diffusion, a phosphorus diffusion was effected. The body was placed in a furnace in which nitrogen gas was passed over phosphorus pentoxide at 210°C and heated at 1,000°C for 10 minutes. The body was removed from the tube, the silicon oxide layer removed and thereafter the gallium diffusion was effected under similar conditions as in Example 3, that is, for 12 minutes at 1,300°C. This gave the following values:

$x_e = 3.6\ \mu$, $x_{b_1} = 4.7\ \mu$, $x_{b_2} = 6.4\ \mu$,
$w = 1.1\ \mu$, and $d = 1.7\ \mu$.

EXAMPLE 6

The conditions were similar to those for Example 5, except that the phosphorus diffusion was effected for a shorter period, namely 5 minutes at 1,000°C. This gave the following values:

$x_e = 5.0\ \mu$, $x_{b_1} = 7.3\ \mu$, $x_{b_2} = 8.2\ \mu$,
$w = 2.3\ \mu$, and $d = 0.9\ \mu$.

EXAMPLE 7

In this Example, the initial diffusion was of arsenic for 90 minutes at 1,000°C. The silicon oxide layer was then removed and a boron diffusion effected for 120 minutes at 1,100°C. The following values were obtained:

$x_e = 2.6\ \mu$, $x_{b_1} = 4.9\ \mu$; $x_{b_2} = 5.8\ \mu$,
$w = 2.3\ \mu$, $d = 0.9\ \mu$.

A method of manufacturing a silicon epitaxial planar double diffused transistor will now be described with reference to FIGS. 2 to 18 of the accompanying drawings which show sections through part of a semiconductor body during consecutive stages of the manufacture.

The manufacture starts from a slice of 2.5 cm. diameter of low resistivity n-type silicon in which phosphorus is the donor impurity element in a concentration $3 \times 10^{18}$ atoms/cc., which is lapped to a thickness of 250 $\mu$ and polished so it has a damage free crystal structure and an optically flat finish on one of its larger surfaces. The starting material being a slice of 2.5 cm. diameter will yield a plurality of transistors by carrying out subsequent steps in the manufacture using suitable masks such that a plurality of isolated devices are formed on the single slice which are later separated by dicing but the method will now be described with reference to the formation of each isolated device, it being assumed that where masking, diffusion, etching and associated steps are referred to, then these steps are simultaneously carried out for each isolated device on the single slice prior to dicing.

A layer of higher resistivity n-type silicon of 10 $\mu$ thickness is epitaxially grown by deposition from the vapour phase on the prepared surface of the slice, the epitaxial layer containing the donor element phosphorus in a concentration of $2 \times 10^{15}$ atoms/cc. An insulating layer of silicon oxide of about 0.5 $\mu$ thickness is now grown on the surface of the epitaxially deposited layer by treatment at 1,200°C for 35 minutes in an atmosphere of wet oxygen.

Figure 2:
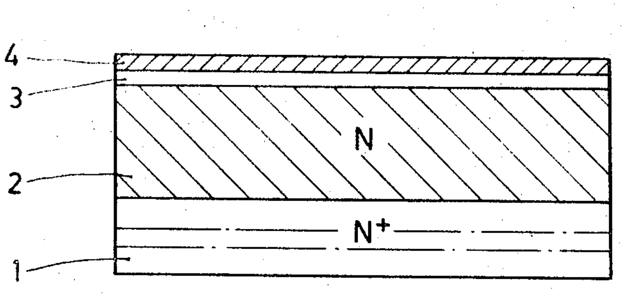
FIGS. 2–5 are cross-sectional views through part of a semiconductor body showing consecutive stages in a process in accordance with the invention common for the manufacture of planar and mesa transistors.

A photosensitive resist layer consisting of material available commercially as K.P.R. (Kodak Photo Resist) is applied to the surface of the silicon oxide layer situated on the epitaxially deposited layer. FIG. 2 shows part of the slice consisting of an $n^+$-type silicon substrate 1 having an n-type silicon epitaxial layer 2 thereon with a silicon oxide layer 3 on the surface of the epitaxial layer 2 covered with a layer 4 of the photoresist.

Figure 3:
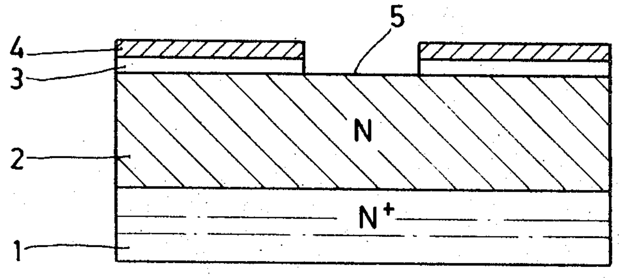

With the aid of a mask the photoresist layer 4 is exposed such that a circular area of 75 $\mu$ diameter is shielded from the incident radiation. The unexposed part of the resist layer is removed with a developer so that a circular opening of 75 $\mu$ diameter is formed in the resist layer. The underlying silicon oxide layer exposed by the opening is now etched with a fluid consisting of hydrogen fluoride and ammonium fluoride. Etching is carried out until an opening of 75 $\mu$ diameter is formed in the silicon oxide layer as shown in FIG. 3.

Figure 4:
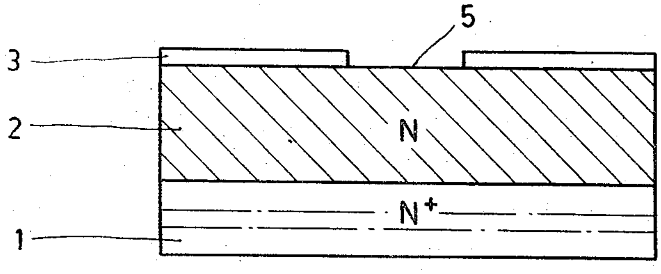

The photosensitive resist layer is then removed from the remainder of the surface of the silicon oxide layer by boiling in a mixture of hydrogen peroxide and sulphuric acid. This results in a body part as is shown in FIG. 4 with an opening 5 in the silicon oxide layer.

Figure 5:
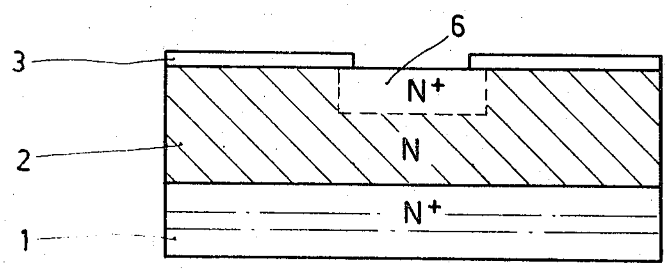

The body is now placed in a two zone furnace and arsenic is diffused into the surface exposed by the opening 5 to form an emitter concentration which is constituted by a low resistivity $n^+$-type region adjacent the surface. The $n^+$ region 6 is indicated in FIG. 5 as having a boundary but in practice the decrease of the donor concentration from the surface with increasing distance from the surface will be gradual. The diffusion is carried out in a two zone furnace with an arsenic source consisting of arsenic trioxide maintained at a temperature 1,200°C in one zone and the silicon body is maintained at a temperature of 1,280°C in the other zone. The diffusion is effected by passing nitrogen over the heated arsenic trioxide and then over the silicon body. The diffusion time is 4 minutes and this results in a surface concentration of arsenic in the $n^+$ region of greater than $10^{21}$ *atoms/cc.*

Figure 6:
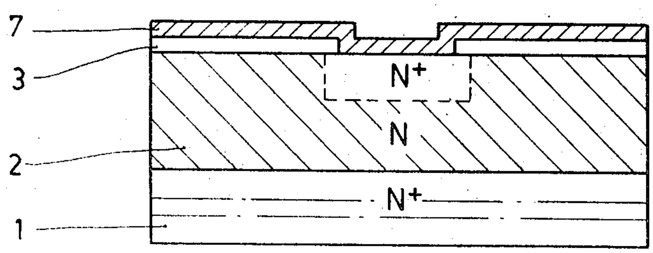
FIGS. 6–18 are similar views showing the remaining process steps representing the further stages in the manufacture of the planar transistor.
Figure 7:
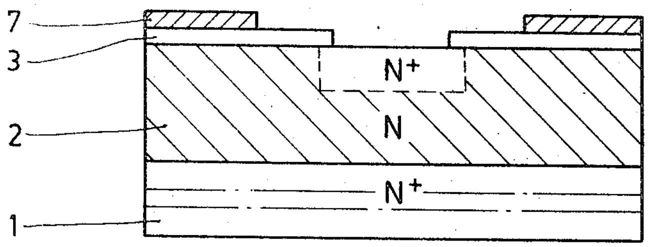
Figure 8:
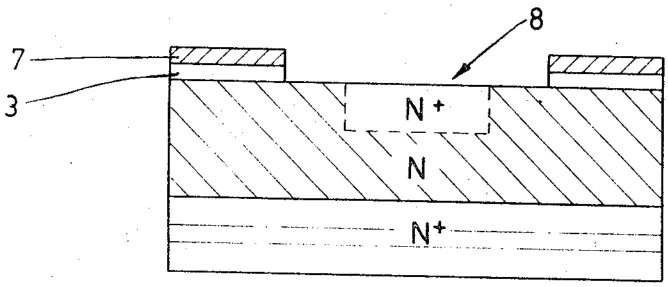

The silicon body is removed from the furnace and a fresh photosensitive resist layer of K.P.R. is applied to the surface. FIG. 6 shows such a photosensitive resist layer 7 on the surface and filling the opening 5. The layer 7 is now exposed with the aid of a mask such that a circular area 175 $\mu$ in diameter which includes the area of the previously formed opening 5, is shielded from the incident radiation. The unexposed part of the layer 7 is removed with a developer so that a circular opening 175 $\mu$ in diameter is formed in the photosensitive resist layer. FIG. 7 shows such an opening in the layer 7. Etching is now carried out with the previously referred to etchant to form a corresponding opening 175 $\mu$ in diameter in the silicon oxide layer at a position below the opening in the photoresist layer. FIG. 8 shows such an opening 8. The remaining photoresist on the surface is now removed by boiling a mixture of hydrogen peroxide and sulphuric acid.

Figure 9:
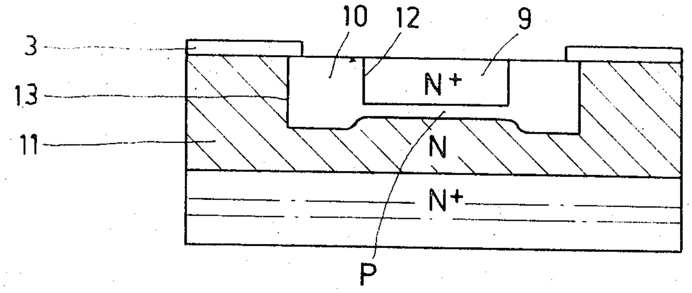

The body is placed in a two zone furnace and boron is diffused into the surface portion exposed by the opening 8. The boron diffusion is retarded in the $n^+$ region, that is in the region containing a high concentration of diffused arsenic. The diffused boron concentration near the surface is lower than that of the arsenic and hence the boron diffusion results in the simultaneous formation of two p-n junctions which both extend to the surface. FIG. 9 shows the body after the boron diffusion having an $n^+$ emitter region 9, a p-type base region 10, an n-type collector region 11, an emitter base junction 12 and a collector-base junction 13. Due to the selective retardation of the boron, part of the base region 10 lying below the emitter is at a depth from the surface less than the adjacent part which extends to the surface. The boron diffusion is carried out in a two zone furnace in which a boron source consisting of boron trioxide is maintained at a temperature of 920°C in one zone and the silicon body is maintained at a temperature of 1100°C in the other zone. The diffusion is effected by passing first nitrogen and then hydrogen over the heated boron trioxide and then over the silicon body. The conditions of diffusion are adjusted such that the emitter-base junction is finally located at a depth of 3 $\mu$ from the surface, the two parts of the base region are at depths of 4 $\mu$ and 5 $\mu$ respectively, that is, the base width under the emitter is 1 $\mu$ and the retardation is 1 $\mu$. The boron surface concentration is of the order of $10^{18}$ atoms/cc. During the boron diffusion the surface of the body in the opening 8 becomes covered with a thin layer of boron glass and underlying silicon oxide. (Not shown in Figure).

Figure 10:
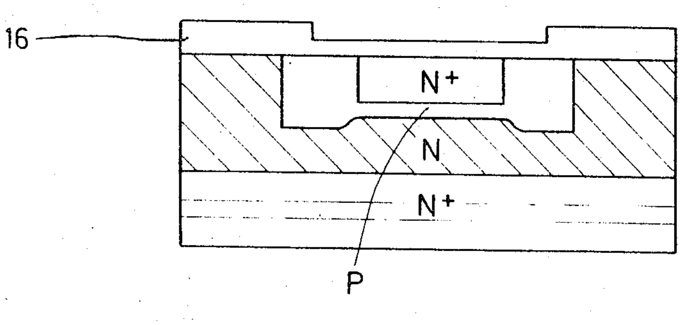

The body is removed from the furnace and a further silicon oxide layer grown in the opening 8 and the silicon oxide layer remaining on the surface is made thicker. FIG. 10 shows the body with the regrown oxide layer 16 on the surface.

Figure 11:
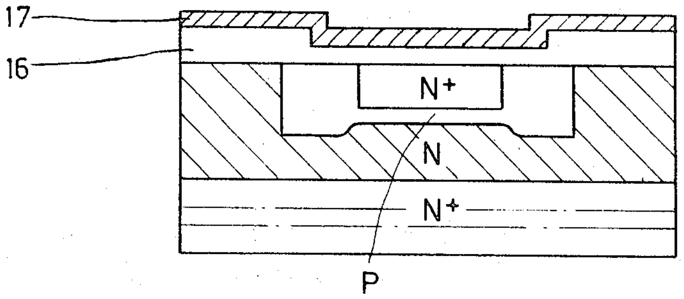

A layer 17 of photosensitive resist, K.P.R., is then applied to the silicon oxide layer as is shown in FIG. 11.

Figure 12:
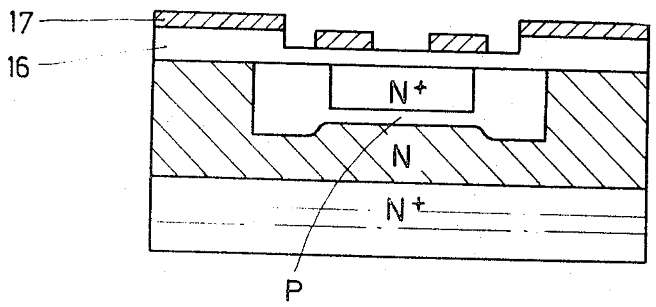
Figure 13:
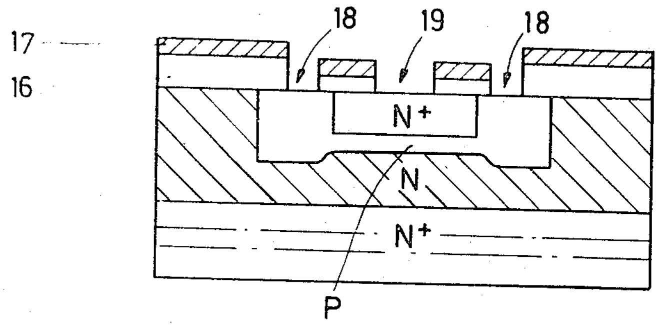

With the aid of a mask the layer 17 is exposed so that two areas are shielded from the incident radiation, one being a circular area of 50 μ diameter located above the emitter region 9 and the other being of annular form of 100 μ internal diameter and 150 μ external diameter and located above the base region 10 where it extends to the surface. The unexposed part of the resist layer 17 is removed by developing so that two openings are formed in the photoresist layer as is shown in FIG. 12. Etching is now carried out with the previously referred to solution to form corresponding openings in the silicon oxide layer at positions below the openings in the photo-resist layer 17. FIG. 13 shows the openings 18 and 19 in the layer 16. The remainder of the photoresist layer is now removed by boiling a mixture of hydrogen peroxide and sulphuric acid.

Figure 14:
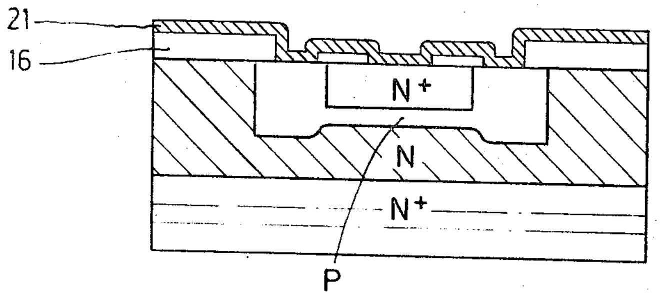
Figure 15:
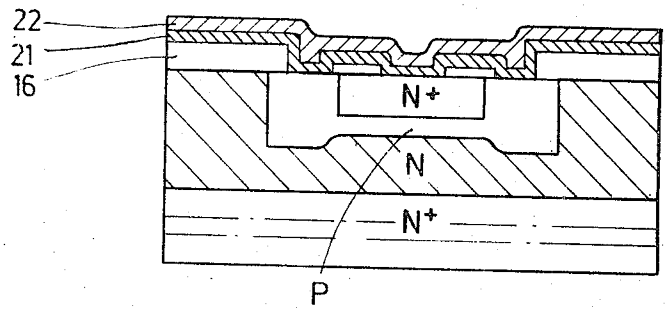
Figure 16:
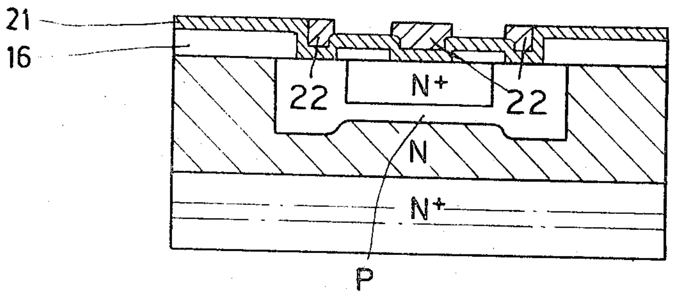
Figure 17:
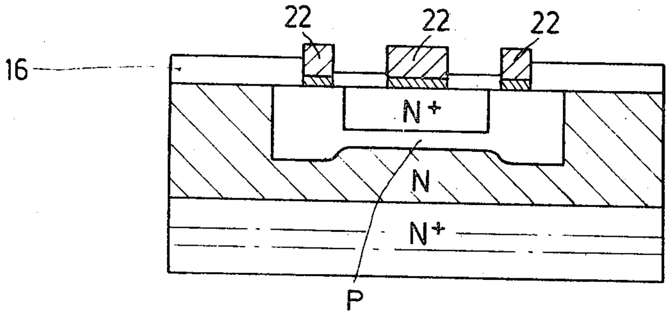
Figure 18:
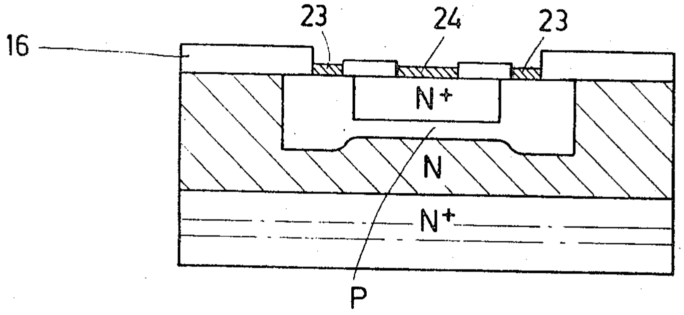

Aluminum is now evaporated over the upper surface of the body. FIG. 14 shows the aluminum layer 21 in the openings 18 and 19 and on the surface of the silicon oxide layer 16. The surface is now covered with a photosensitive lacquer available commercially as "Kopierlac". FIG. 15 shows the layer 22 of lacquer. The lacquer is exposed with the aid of a mask such that areas of the same dimensions and in registration with the previously formed openings 18 and 19 are exposed to the incident radiation. Unexposed parts of the lacquer layer are then removed using a weak potassium hydroxide solution. This leaves portions of the lacquer layer above the remaining layer 21 at positions corresponding to the location of the openings 18 and 19 in the silicon oxide layer as is shown in FIG. 16. The parts of the aluminum layer 21 not protected by the lacquer layer are then dissolved in orthophosphoric acid to give a body as shown in FIG. 17. The remaining lacquer is then dissolved in acetone. A body as shown in FIG. 18 is thus obtained with remaining layers 23 and 24 in the windows 18 and 19 respectively in the silicon oxide layer 16. The body is now placed in a furnace at 600°C for 3 minutes in a nitrogen atmosphere to alloy the aluminum layers 23 and 24 with the underlying surface parts of the body to form ohmic contact to the base and emitter regions respectively.

Thereafter the silicon wafer is divided into a plurality of separate smaller wafers to yield a plurality of transistor sub-assemblies. The $n^+$ substrate part of each sub-assembly is soldered to a header part of an envelope. Wires are then thermocompression bonded to the aluminum layers 23 and 24 and the other extremities of the wires are connected to posts on the periphery of the header. The transistor is then encapsulated by sealing a cap portion of the header.

A method of manufacturing a silicon epitaxial mesa double diffused transistor will now be described with reference to FIGS. 2 to 5 and FIGS. 19 to 23 of the accompanying drawings which show sections through part of a semiconductor body during consecutive stages of the manufacture.

Figure 19:
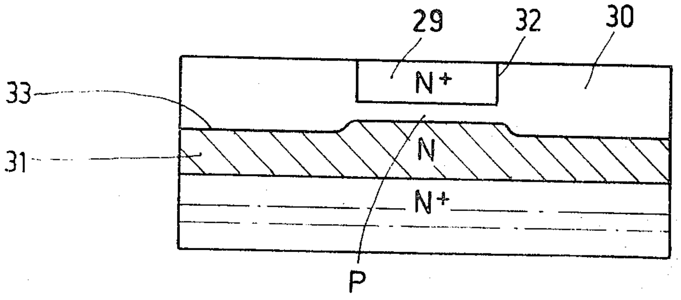
FIGS. 19–23 are similar views representing further stages in the manufacture of the mesa transistor.

The method is identical with the previously described method up to and including the step of the arsenic diffusion which has been described with reference to FIGS. 2 to 5. Thereafter the silicon oxide layer 3 remaining on the surface is removed by dissolving in hydrogen fluoride. The body is now placed in a two zone furnace and gallium is diffused over the whole surface to form a structure as shown in FIG. 19. The gallium diffusion is retarded in a manner similar to the retardation of boron described in the previous method. Thus FIG. 19 shows an $n^+$-type emitter region 29, a p-type base region 30, an n-type collector region 31, an emitter-base junction 32 extending to the surface and a collector-base junction 33 extending across the body. The gallium diffusion is carried out in a two zone furnace in which a gallium source consisting of gallium trioxide is maintained at a temperature of 1,200°C in one zone and the silicon body is maintained at a temperature of 1,250°C in the other zone. The gas stream is of a mixture of nitrogen and hydrogen. The conditions of diffusion are adjusted so that the base width and depth is substantially similar to that described in the previous method. During the diffusion a glass layer is formed on the surface and this is subsequently dissolved in hydrofluoric acid.

Figure 20:
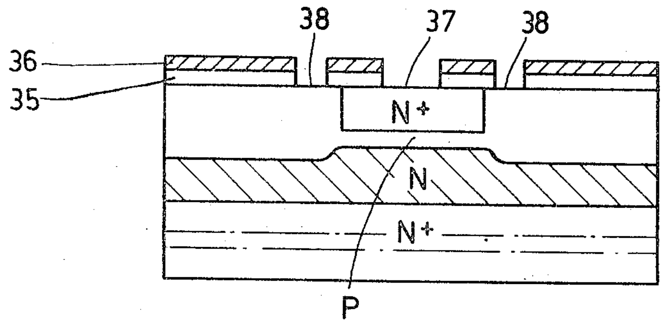
Figure 21:
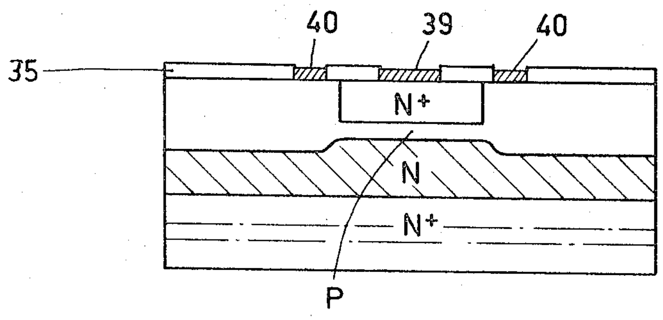
Figure 22:
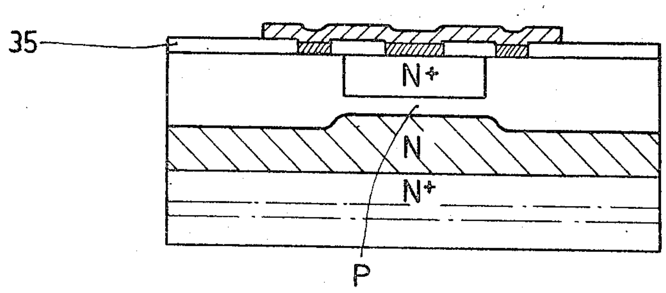

A layer 35 of silicon oxide is then regrown on the surface and a layer 36 of photosensitive resist applied to the layer 35. Similar techniques as those previously described are employed to form openings 37 and 38 in the silicon oxide layer 35 at positoins corresponding to the location of the emitter and base regions on the surface. FIG. 20 shows the openings 37 and 38 in the oxide layer 35 with the remaining parts of the photoresist layer 36 on the silicon oxide layer. These parts of the layer 36 are then removed. Thereafter aluminum is evaporated over the whole surface and with similar photoprocessing and etching techniques as described in the previous method aluminum layers 39 and 40, as is shown in FIG. 21 are obtained in the openings 37 and 38 respectively. After alloying the aluminum to the underlying body parts a layer of photosensitive resist available commercially as K.M.E.R. (Kodak Metal Etch Resist) is applied to the surface and by photoprocessing techniques is selectively removed to leave a layer 41 as is shown in FIG. 22.

Figure 23:
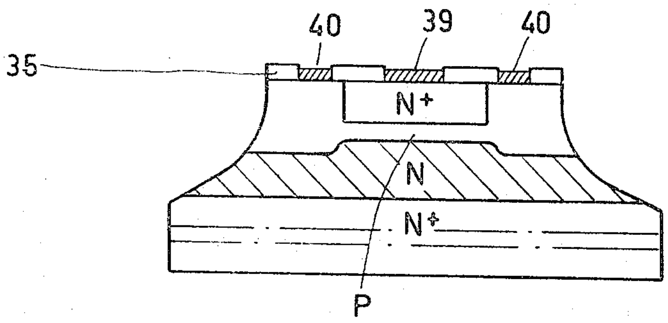

The body is now etched to form a mesa structure by etching with a mixture of hydrogen fluoride, nitric acid and acetic acid. This yields a body as shown in FIG. 23. The slice is then divided into transistor sub-assemblies each of which are soldered to a header, wires are bonded to the layers 39 and 40 and encapsulation is effected similarly as in the previously described method.

What is claimed is:

1. A method of manufacturing a transistor, comprising providing a body having at least a semiconductive part of silicon containing a substantially uniform concentration of one type of conductivity-type-determining impurities and a plane surface, forming on the said plane surface an adherent protective insulating layer, providing a first opening in the insulating layer to form a first exposed limited portion of said plane surface of said body part, diffusing into said first exposed surface portion said one type impurities having a relatively slow rate of diffusion therein and in quantities yielding a relatively high diffused concentration, thereafter forming in the insulating layer a second opening larger than the first opening to form a second exposed limited portion of said plane surface of said body part, and diffusing into said second exposed surface portion conductivity-type-determining impurities of the opposite type having a relatively high rate of diffusion in the body part but in quantities yielding a relatively lower diffused concentration until the opposite type impurities penetrate into said body part to a greater depth than said one type diffused impurities forming a first p-n junction with the initial body part and a second p-n junction with the body part containing the diffused one type impurities, said insulating layer being impervious to both diffused one type and opposite type impurities, said second exposed plane surface portion having a greater surface area than and including and completely surrounding on all sides said first exposed plane surface portion, whereby the later diffused opposite type impurities which traverse a region of said body part which contains the one type diffused impurities are selectively retarded and penetrate to a lesser depth than those which traverse surrounding regions free of said one type diffused impurities and thus the part of the first p-n junction underneath the first exposed portion lies less deeply in the body than the parts of the first junction in surrounding portions.

2. A method as set forth in claim 1 wherein the said one type diffused impurity is arsenic or antimony, and the opposite type impurity is boron.

3. A method as set forth in claim 2 wherein, during or following diffusion of the boron, the adherent protective insulating layer is reformed on the plane surface, additional openings are formed in the reformed layer over the said first exposed surface portion and over the second exposed surface portion spaced from the first exposed surface portion, and ohmic contacts are made through the additional openings to the semiconductive regions thus exposed while leaving permanently in place the reformed insulating layer covering the plane surface and the first and second p-n junctions where they extend to the plane surface.

* * * * *